US009780138B2

(12) United States Patent
Dupont

(10) Patent No.: US 9,780,138 B2
(45) Date of Patent: Oct. 3, 2017

(54) THREE LEVEL TRANSFER GATE

(71) Applicant: Caeleste CVBA, Mechelen (BE)

(72) Inventor: Benoit Dupont, Schaarbeek (BE)

(73) Assignee: CAELESTE CVBA, Mechelen (BE)

( * ) Notice: Subject to any disclaimer, the term of this patent is extended or adjusted under 35 U.S.C. 154(b) by 0 days.

(21) Appl. No.: 14/554,327

(22) Filed: Nov. 26, 2014

(65) Prior Publication Data
US 2016/0148962 A1 May 26, 2016

(51) Int. Cl.
H01L 27/14 (2006.01)
H04N 5/355 (2011.01)
H04N 5/3745 (2011.01)
H01L 27/146 (2006.01)

(52) U.S. Cl.
CPC .. *H01L 27/14643* (2013.01); *H01L 27/14612* (2013.01); *H04N 5/3559* (2013.01); *H04N 5/37452* (2013.01)

(58) Field of Classification Search
CPC ......... H01L 27/14614; H01L 27/14638; H01L 27/14643; H01L 27/14612; H01L 27/14609; H01L 27/14656; G01T 1/24; G01T 1/245; G01T 1/246; G01T 1/247
USPC .......... 250/208.1, 370.01, 206, 214.1, 214 P, 250/332, 338.4, 370.08, 336.1, 338.1; 257/230
See application file for complete search history.

(56) References Cited

U.S. PATENT DOCUMENTS 5,625,210 A * 4/1997 Lee ................... H01L 27/14609
257/233
8,471,315 B1 * 6/2013 Hynecek ............ H01L 27/14603
257/233
8,723,284 B1 5/2014 Hynecek
2001/0032979 A1 * 10/2001 Rhodes ............. H01L 27/14603
257/59
2004/0239791 A1 * 12/2004 Mabuchi ................ H04N 3/155
348/315

(Continued)

FOREIGN PATENT DOCUMENTS

EP 2107610 A2 10/2009

OTHER PUBLICATIONS

Solhusvik et al., "A 1280×960 3.75um Pixel CMOS Imager with Triple Exposure HDR", Aptina Imaging, 4 Pages, Received Jun. 3, 2016.

(Continued)

Primary Examiner — David Porta
Assistant Examiner — Blake Riddick
(74) Attorney, Agent, or Firm — Workman Nydegger

(57) ABSTRACT

A method and device of driving a radiation sensor pixel is disclosed. The sensor pixel comprises a sensing element capable of charge generation as a response to impinging radiation, a floating diffusion node, a transfer gate between the sensing element and the floating diffusion node, and a charge storage device connected to the floating diffusion node via a switch. The method comprises biasing the transfer gate to three or more bias voltages OFF, ON and an intermediate bias between OFF and ON. During the period in which the transfer gate is biased to the intermediate bias, if the sensor reaches saturation, the overflown charges may be collected and part of them stored in the charge storage device, for further analysis and merging.

20 Claims, 11 Drawing Sheets

(56) References Cited

U.S. PATENT DOCUMENTS

| | | | |
|---|---|---|---|
| 2005/0083421 A1* | 4/2005 | Berezin | H04N 3/155 348/308 |
| 2006/0001061 A1* | 1/2006 | Miyatake | H04N 5/35518 257/292 |
| 2006/0219868 A1 | 10/2006 | Morimoto et al. | |
| 2006/0266922 A1* | 11/2006 | McGrath | H01L 27/14609 250/208.1 |
| 2007/0096238 A1 | 5/2007 | Oike et al. | |
| 2009/0103827 A1* | 4/2009 | Ladd | G06K 9/40 382/260 |
| 2009/0128677 A1* | 5/2009 | Kozlowski | H04N 5/23245 348/308 |
| 2009/0190016 A1* | 7/2009 | Iida | H01L 27/14656 348/308 |
| 2010/0188540 A1* | 7/2010 | Bechtel | H04N 5/378 348/302 |
| 2012/0002089 A1* | 1/2012 | Wang | H01L 27/14603 348/297 |
| 2012/0132820 A1* | 5/2012 | Iwakiri | G01T 1/2018 250/370.08 |
| 2012/0193516 A1 | 8/2012 | Bogaerts | |
| 2012/0256077 A1* | 10/2012 | Yen | H01L 27/14609 250/208.1 |
| 2012/0320245 A1* | 12/2012 | Hasegawa | H04N 5/3742 348/300 |
| 2014/0077062 A1* | 3/2014 | Hynecek | H01L 27/14887 250/208.1 |
| 2014/0085523 A1* | 3/2014 | Hynecek | H01L 27/14605 348/311 |
| 2014/0103411 A1* | 4/2014 | Dai | H01L 27/14609 257/292 |
| 2014/0263947 A1 | 9/2014 | Dierickx | |
| 2014/0267855 A1 | 9/2014 | Fan | |
| 2014/0367552 A1 | 12/2014 | Hynecek et al. | |
| 2016/0126282 A1* | 5/2016 | Chen | H01L 27/14643 257/225 |

OTHER PUBLICATIONS

Darmont, Methods to Extend the Dynamic Range of Snapshot Active Pixels Sensors', www.melexis.com, Electronic Imaging Proceedings, 2008, 12 Pages.

Hara et al., "A Linear-Logarithmic CMOS Sensor with Offset Calibration Using an Injected Charge Signal", IEEE International Solid-State Circuits Conference, Feb. 8, 2005, 3 Pages.

Loose et al.,"A Self-Calibrating Single-Chip CMOS Camera With Logarithmic Response", IEEE Journal of Solid-State Circuits, vol. 36, No. 4, Apr. 2001, pp. 586-596.

Sugawa et al., "A 100dB Dynamic Range CMOS Image Sensor Using a Lateral Overflow Integration Capacitor", IEEE International Solid-State Circuits Conference, Feb. 8, 2005, 3 Pages.

Belgian Search Report from Belgian Application No. 201505771, dated Oct. 18, 2016.

* cited by examiner

THREE LEVEL TRANSFER GATE

FIELD OF THE INVENTION

The present invention relates to the field of radiation sensor pixels suitable for use in sensor arrays. In particular the present invention relates to a sensor with high dynamic range and to a driving method for such sensor.

BACKGROUND OF THE INVENTION

Due to miniaturization, sensor arrays usually suffer from leakage currents that degrade an image captured by the sensor arrays. The use of integrated microelectronic elements (like transistors or photodiodes) in monolithic sensors is an important technique that allows the fabrication of very small radiation sensor pixels, but due to the type of materials and the very small dimensions and distances between electronic elements, leakage currents often occur. One of the characteristics of the sensing element contributing to this effect is its limited sensitivity. When impinging radiation surpasses a predetermined threshold limit, the sensor saturates, and further increase of radiation intensity may lead to leakage. Some solutions have been proposed. For instance, use of pixels with a wide area may lead to an increase of saturation limit. This solution is very limited, due to the fact that a sensor array should be able to have high sensor density (e.g. high number of pixel per inch) in order to be competitive.

Other solutions remove excess charge by draining, thus avoiding leakage, in saturated pixels. While leakage and related effects (as ghosting or blooming) are reduced, the sensor saturates and the image quality is not optimal.

Dynamic range can be defined as the ratio between the smallest and the highest radiation intensity capable of producing a variation in the radiation sensor. It is desirable to have high dynamic range (HDR) in a sensor, while at the same time reducing leakage currents in a sensor array, in order to obtain an optimal configuration suitable for sensor arrays. Several alternatives and sensor configurations have been proposed.

US2012/0193516 discloses a pinned photodiode (PPD) with capacitors for storing charge, increasing dynamic range. The capacitance of the capacitors is higher than the capacitance of the sensor. Additionally, a lateral overflow barrier can be used to reduce leakage current during charge generation and collection in the photodiode.

The fabrication of a sensor suitable for sensor arrays, allowing a reduced leakage and high dynamic range, is desirable, while simultaneously avoiding increasing the area of the sensor (thus avoiding a reduction of resolution), avoiding reducing the sensitive area (thus obtaining a good saturation) and avoiding costly manufacturing routes.

SUMMARY OF THE INVENTION

It is an object of embodiments of the present invention to provide a radiation sensor pixel and a method for driving a radiation sensor pixel suitable for sensor arrays providing good image quality, low leakage currents and allowing high dynamic range imaging.

The above objective is accomplished by a method and a device according to embodiments of the present invention.

In a first aspect, embodiments of the present invention relate to a method of driving a radiation sensor pixel. The radiation sensor pixel comprises a sensing element capable of charge generation as a response to impinging radiation, a floating diffusion node, a transfer gate between the sensing element and the floating diffusion node, and a charge storage device connected to the floating diffusion node via at least one switch. The method comprises subsequently biasing the transfer gate to at least three different bias voltages, wherein the at least three different bias voltages comprise at least an OFF bias voltage, an ON bias voltage and an at least one intermediate bias voltage. The at least one intermediate bias voltage has a value within the range between the OFF bias voltage and the ON bias voltage. The method further comprises allowing the charge storage device to accept charges, at least during biasing the transfer gate to the intermediate bias voltage. It is an advantage of embodiments of the present invention that any possible overflow can be controlled by means of a single transistor by the selectable intermediate bias voltage, avoiding leakage of currents and related negative effects, while simultaneously collecting the overflown charges and enabling accounting for their influence.

In particular embodiments of the present invention, the method may include at least an integration period in which charges are integrated on the sensing element. Subsequently biasing the transfer gate to at least three different bias voltages may include biasing the transfer gate to the intermediate bias voltage during at least part of the integration period, thus transferring to the floating diffusion node and the charge storage device part of the integrated charges that may overflow the transfer gate (corresponding to a predetermined threshold). It is an advantage of embodiments of the present invention that the charges produced by oversaturation of the pixel can be measured. It is an advantage of embodiments of the present invention that the value of the saturation level of the pixel can be set arbitrarily low during charge integration, allowing a great control at different intensities of impinging radiation. It is an additional advantage that the charges produced by oversaturation of the pixel can be collected.

Some embodiments of the method according to the present invention may include additional periods. For example, they may include an integration period and further a readout period. Each period may comprise several phases, which will be described within the frame of different embodiments of the present method.

Certain embodiments of the first aspect of the present invention, for example, may further include a readout period. This readout period may include, according to some embodiments of the method of the present invention, reading out the charges previously integrated on the sensing element. It may also include, in further embodiments of the present invention, merging charges stored on the charge storage device with charges present on the floating diffusion node. It is an advantage of embodiments of the present invention that charges collected during integration may be part of the signal readout.

In some embodiments of the present invention, subsequently biasing the transfer gate to at least three bias voltages may further comprise a transitory biasing of the transfer gate to ON bias, thus transferring the integrated charges to the floating diffusion node, while not allowing the charge storage device to accept charges, and subsequently reading the charge levels in the floating diffusion node. This phase may be included in the readout phase, although the present invention is not limited thereto. It is an advantage of embodiments of the present invention that the total charge produced by the impinging radiation can be collected over the pixel saturation level.

Particular embodiments of the present invention may further comprise additional steps or periods. For example, certain embodiments may include biasing the transfer gate by the OFF bias voltage between the integration period and a subsequent readout period. It is an advantage of embodiments of the present invention that it allows the measurement of reset levels. It is an advantage of embodiments of the present invention that not only the total charge accumulated can be collected and measured, but also the level of saturation can be obtained and corrected for increasing the dynamical range of the pixel.

The charge at different phases may be analyzed in different ways. Certain embodiments of the present invention, for example, include obtaining correlated double sampling (CDS) output. In certain embodiments of the present invention, the CDS output is calculated on the difference in charges present on the floating diffusion node before and after biasing the transfer gate ON. It is an advantage of embodiments of the present invention that the total charge accumulated during the previous step can be additionally collected.

In advantageous, not limiting embodiments of the present invention, transferring part of the integrated charges is performed solely through the transfer gate. In such embodiments, the pixel can be advantageously compact. No supplementary device features such as for instance lateral overflow gates, are required.

Other embodiments may allow a reset of the sensing element, for example by inclusion of a flush gate, obtaining the advantageous properties of a sensor shutter. It is an advantage of embodiments of the present invention that high dynamic range and reduced negative effects stemming from charge leakage may be obtained, without the need of including additional transistors; hence compact pixel circuits can be used.

In a second aspect of embodiments of the present invention, the present invention also relates to a radiation sensor pixel. The radiation sensor pixel according to embodiments of the present invention may advantageously be driven according to a method embodiment of the first aspect of the present invention. Said device according to embodiments of the present invention may comprise a sensing element capable of charge generation as a response to impinging radiation, a floating diffusion node, a single transfer gate between the sensing element and the floating diffusion node, a charge storage device connected to the floating diffusion node, and advantageously a drive circuit adapted for subsequently biasing the single transfer gate to at least three different bias levels. It is an advantage of embodiments of the present invention that a limited number of transistors in a pixel can be used, hence reducing the size of the sensor and thus allowing higher sensor density in a sensor array. For example, in certain embodiments comprising pixels, a higher pixel density in a camera array can be obtained. It is an additional advantage that the sensitivity of the sensor can be manipulated, so high dynamic range is obtained in a small and compact device.

Certain embodiments of the present device according to the second aspect of the present invention may comprise an output stage configured to generate a signal representative of the amount of electrical charge on the floating diffusion separately, on the charge storage device separately, or on both. This may include analog-to-digital converters, analog readers, integrated circuits, the present invention not being limited by such examples, and may be suitable for measuring the signal level of radiation received by the radiation sensor pixel. It is an advantage of embodiments of the present invention that the sensor may have radiometry applications. It is an additional advantage that the present invention may have photometry applications.

The device according to some embodiments of the present invention may be manufactured in a substrate with semiconducting properties, for example a semiconductor, for example Si, or Ge, or a mixture of several elements like SiGe; GaAs, or InGaAs, or any other suitable combination. In advantageous embodiments of the present invention, the sensing element may comprise an area of the substrate, for example it may comprise a at least one photoelectric diode, for example a pinned photodiode. It is an advantage of embodiments of the present invention that low dark current and high quantum efficiency can be obtained. It is an additional advantage that standard fabrication methods for buried or pinned photodiodes can be used. The photodiode may for example be manufactured by layered p-n doping in a lightly p– doped substrate. The present invention may encompass other type of semiconductor structures, or even to different sensing elements.

According to embodiments of the present invention, the device includes a charge storage device coupled to the output. This charge storage device, in different embodiments of the present invention, may comprise for example one capacitor, coupled to the output through a switch, for example a transistor like a MOSFET, TFET, or any other type of switch. The capacitor may be an external circuit element, or may be integrated in a substrate in embodiments including integrated sensors, for example in monolithic devices. The present invention is not limited to such structure, and it may comprise more than one capacitor, as well as other elements and switches. For example, the charge storage device may comprise a couple of capacitors connected in parallel between them, increasing the capacitance. It is an advantage of embodiments of the present invention that the charge storage device can be easily implemented in a circuit.

In some advantageous embodiments of the present invention, the charge storage device may comprise a merger transistor configured to selectively open a conductive path between the charge storage device and the floating diffusion node, advantageously collecting the overflown charges, which can be measured for estimation of oversaturation levels. Other possible configurations may include for example three capacitors in parallel configuration, connected between each other via a switch. It is a further advantage of embodiments of the present invention that different levels of saturation can be controlled and measured for the same intermediate voltage $V_M$, further reducing any possible leakage current that may still exist. For example, in certain embodiments, the extra capacitors are used (e.g. their switches are opened) in case the main capacitor of the storage device saturates.

Some embodiments of the present invention comprise at least one reset transistor. For example a transistor may regulate the connection between the floating diffusion and the source VDD, so the sensing element may be swiftly depleted of charge and prepared for new use. This is advantageous especially in photography or video applications, in which the radiation sensor pixel may have reduced image lag. Embodiments of the present invention may comprise at least one alternative or additional transistor for the depletion of the charge storage device CS, advantageously allowing depletion of overflown charge at a different moment than the floating diffusion region. This allows greater control of the accumulation, for instance allowing to control the moment at which charge accumulation starts, or allowing several cycles of charge accumulation if desired.

The device according to a second aspect of the present invention may comprise other configurations and structures in so far these features allow the operation according to embodiments of the first aspect of the present invention. For example, some embodiments may comprise a flush gate connected to the sensing element, allowing more control in during the integration and readout periods, and obtaining fast processing with good sensitivity and compact optical system. In pixel arrays using the sensor according to these embodiments, electronic global shutter effect can be obtained.

Embodiments of the present invention may comprise detection of any type of radiation, for example ionizing radiation, corpuscular radiation (alpha particles, beta particles, neutrons, etc.). Some embodiments of the present invention comprise a method and device for detection of electromagnetic (EM) radiation, for example gamma radiation, X-rays, or within the range between far infrared and ultraviolet, for example within the range of visible radiation. In case of these particular embodiments for EM radiation, the sensing element would comprise a photoelectric sensing element, and the charges would comprise photocharges.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
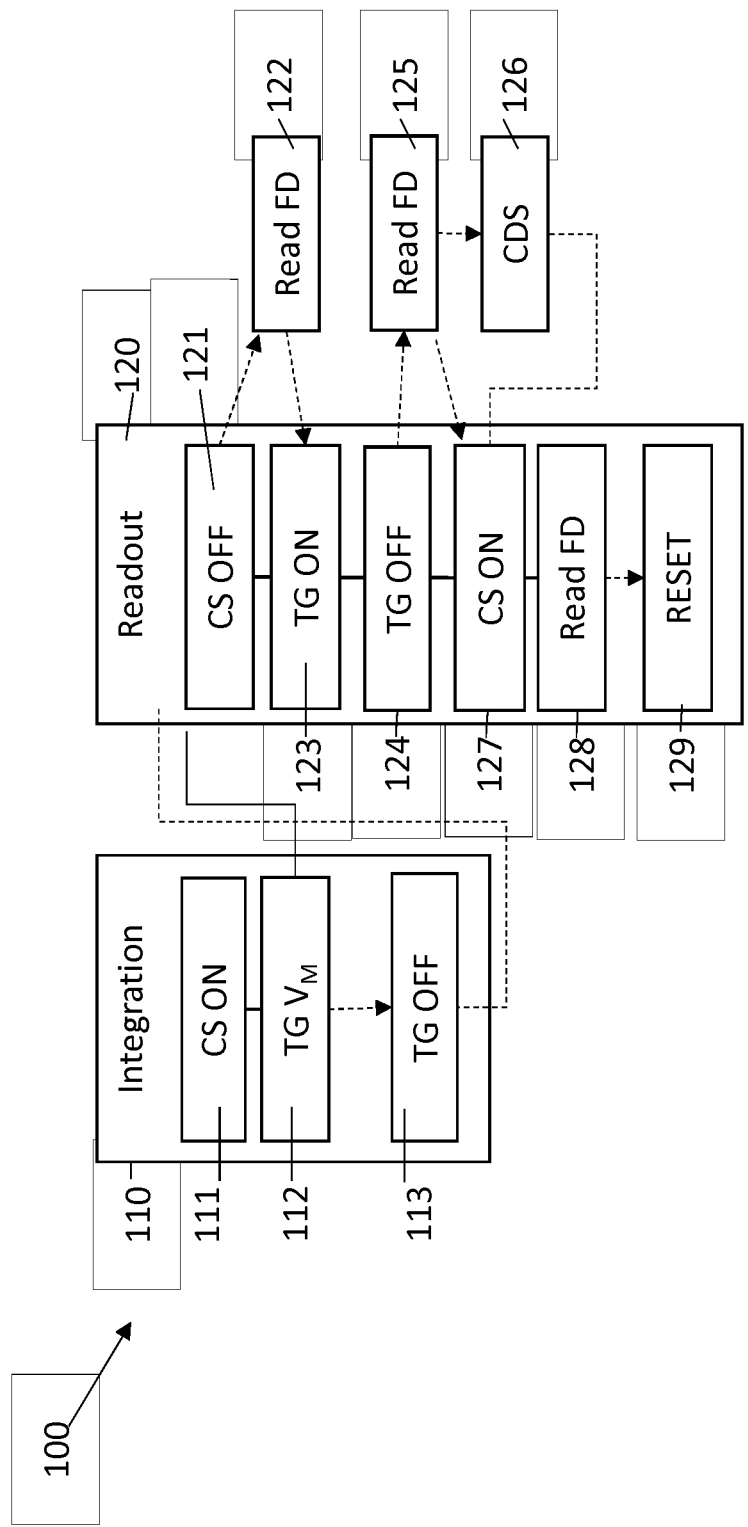
FIG. 1 shows a flowchart of a method according to embodiments of the present invention for driving a radiation sensor pixel.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to sensing element, reference is made to the element in a radiation sensor pixel which generates charges when radiation impinges on the element. In advantageous embodiments of the present invention, the sensing element is a photoelectric sensing element, which generates photocharges upon impinging of electromagnetic (EM) radiation (X-ray radiation, gamma radiation, a range of radiation between infrared and ultraviolet, for example visible light in applications related to pixel devices). Accordingly, when reference is made to charges, reference is made to electric charges, for example photocharges produced by EM radiation in those embodiments comprising a photoelectric sensing element. The present invention is not limited thereto, and the sensing element may generate charges upon impinging of other types of radiation, like ionizing radiation, corpuscular radiation (e.g. alpha radiation), etc.

When in embodiments of the present invention reference is made to a charge storage device (or CS, for sake of brevity), reference is made to any element or circuit configuration capable of storing charges (e.g. photocharges) and selectively discharging them according to the needs of the user, or of the particular operation stages of the radiation sensor pixel. In some non-limiting embodiments of the present invention, the charge storage device may comprise circuit elements like capacitors.

Where in embodiments of the present invention reference is made to a switch, reference is made to a device (e.g. a transistor, the present invention not being limited thereto) that can regulate the current between two states (ON or OFF), for example the switch or switches controlling the circulation of charge from and to the storage device. They can be regulated externally or programmed, and may be used to merge the charges in the charge storage device and in a floating diffusion node, and also they may be used to control the reset of the radiation sensor pixel.

By floating diffusion node (FD), in embodiments of the present invention, reference is made to a part of the radiation sensor pixel connected to the readout circuit (or output), and it may comprise other connections, like connections to the charge storage device or a reset switch. In embodiments of the present invention comprising monolithic sensors, it may be embedded in the same substrate as the sensing element, for example comprising a doped region.

Where in embodiments of the present invention reference is made to a transfer gate (TG), reference is made to any device that regulates the circulation of the current between a sensing element and a FD. This may be obtained by a biasing electrode and an insulating (e.g. oxide) layer on a channel between the FD and the sensing element, although the present invention is not limited by these examples.

In radiation sensor pixels, a low intensity threshold can be defined, under which the sensing element is not capable to produce enough charges for a meaningful reading. A high threshold can also be defined, which shows the maximum amount of charges produced by the sensing element, beyond which this amount would not increase despite receiving higher dose of radiation. It is then said that the radiation sensor pixel reached saturation. The ratio between the low and the high threshold is the dynamic range. Within the frame of the present invention, the saturation value can be varied in order to change the dynamic range. For example, the dynamic range of the radiation sensor pixel can be increased. In embodiments of the present invention, the saturation value during integration can be selected by biasing the transfer gate to a given bias voltage $V_M$, which would result in a smaller saturation than the maximum sensor saturation value, obtained when the transfer gate is biased to an OFF bias voltage, e.g. zero volts.

Excess charges over the selected saturation may be transferred (by overflowing the transfer gate) to the floating diffusion node. When in embodiments of the present invention reference is made to overflown charges, reference is made to these excess charges that surpass the selected saturation value of charges capable of being contained in the sensing element.

A first aspect of embodiments of the present invention relates to a method of driving a radiation sensor pixel comprising at least one photoelectric sensing element, a floating diffusion node and a transfer gate between the sensing element and the floating diffusion node. A charge storage device is connected to the floating diffusion node via at least one switch. The method allows the subsequent biasing of the transfer gate to at least three different bias voltages, comprising at least OFF ($V_0$), ON ($V_1$) and on or more intermediate bias voltages ($V_M$). For example, the intermediate bias voltage may be a fixed value, or may be selected within a range of possible values between $V_0$ and $V_1$. The values $V_0$, $V_1$, $V_M$ can be selected depending on particular technology parameters, desired functionality and specifications. For example, in particular embodiments, the values used can be $V_0=0$ V, $V_1=3$ V and the intermediate voltage $V_M$ can be 0.8V.

The method 100, illustrated in the flowchart of FIG. 1, may comprise:

An integration step 110. During this step 110, charges (e.g. photocharges, for instance photocharges generated by impinging radiation, for instance but not limited to visible light) are integrated on the sensing element, during an integration period. At the start of the integration period, the charge storage device CS is contacted 111 with the floating diffusion node FD, for example by closing a switch ("opening the gate") between the charge storage device CS and the floating diffusion node FD. The integration period further comprises driving 112 the transfer gate between the sensing element and the floating diffusion node to a predetermined intermediate bias voltage $V_M$, according to the desired saturation value of the sensing element. Any possible overflown charge may be transferred into the FD, and the CS is allowed to receive charges. At the end of the integration period and before the following period starts, the transfer gate may optionally be driven 113 to an OFF bias voltage (thus opening the switch, or "closing the gate").

A readout step 120. During a readout period corresponding to the readout step, the charge storage is shut off 121, for example by opening a switch between the charge storage device and the floating diffusion node. Any charge collected in the floating diffusion node FD during the integration period may be optionally read 122 from the FD through an output stage, which may be configured to generate a signal representative of the amount of electrical charge, for display or data storage. The integrated charges of the sensing element are transferred to the floating diffusion node by driving 123 the transfer gate to an ON bias (closing the switch, or "opening" the gate). Once the charges are transferred, the transfer gate is biased 124 to an OFF bias voltage (again "closing" the gate, opening the switch). The charges may be read 125 from the floating diffusion node FD. Correlated double sampling (CDS) may optionally be performed 126, advantageously reducing kTC noise. Additionally, a merging step may be performed by connecting 127 the charge storage device CS to the floating diffusion node FD. Then, the charge level of the CS merged with the charges that may have been collected in floating diffusion node FD during the integration period can be obtained 128. The method may include resetting 129 the radiation sensor pixel at the end of the readout period.

The above steps are not limiting for the present invention, as long as the transfer gate is subsequently biased to at least three different bias voltages. Other steps may also be included in methods according to embodiments of the present invention. For example, a cycle of biasing the transfer gate to OFF-ON-OFF states may be also performed during the readout period (e.g. after merging the charges in the FD, or after the first reading) to include charges integrated in the sensing element in the phases in which the transfer gate was "open". It may also be possible to include a flush gate acting as a shutter, for example to obtain a global shutter in a sensor array. The flush gate can be used, for instance, to determine the moment at which the integration period starts. Merging the charges may comprise several merging steps, for example in the case that multiple storage elements comprise the CS. Other additional or alternative steps could be reading the charge directly from the CS, creating a CS signal representative of the stored charge alone, which could then be compared or added to the FD signal alone without merging the charges themselves. Reading the level and producing the signal could be done for instance with analog means like a voltmeter, or with analog-to-digital converters. Additional reset switches may be added in the charge storage device.

Figure 2:
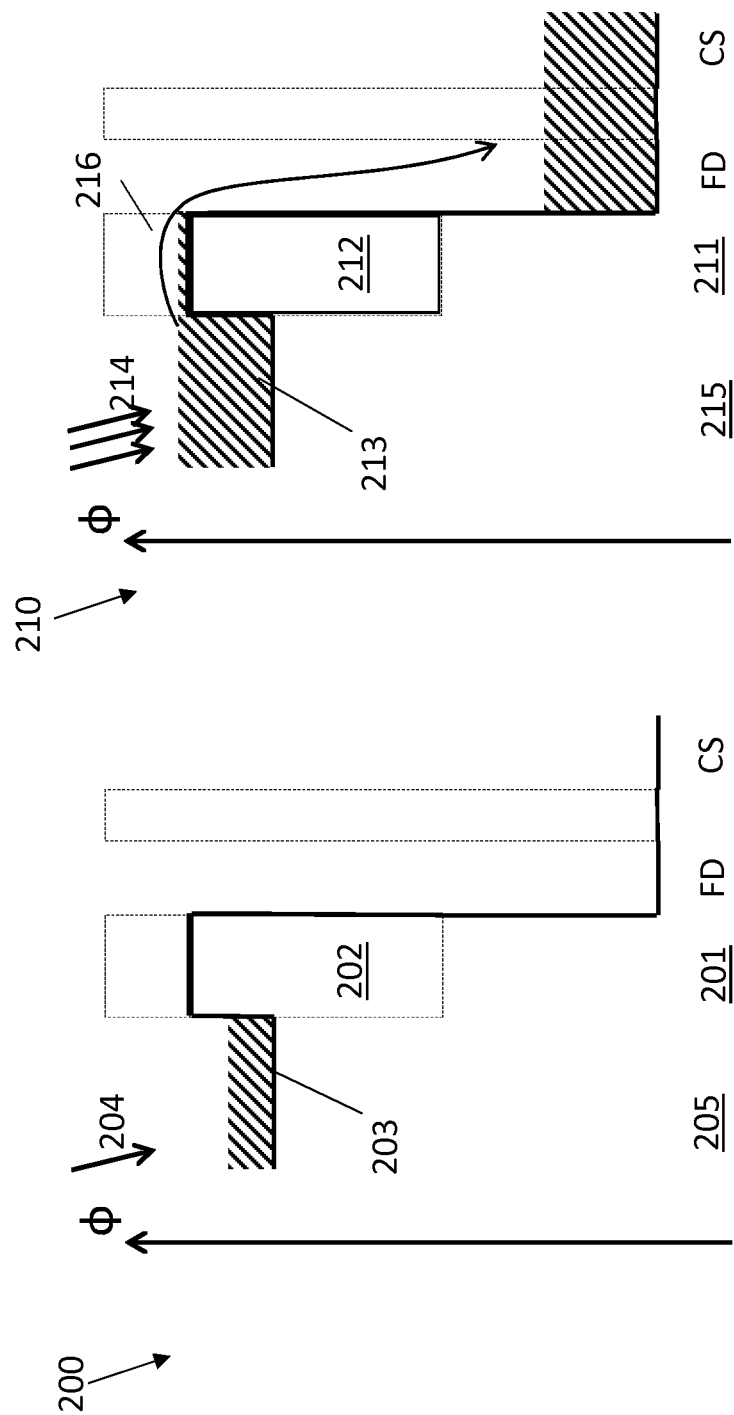
FIG. 2 shows a potential diagram of a radiation sensor pixel during an integration period according to embodiments of methods of the present invention.

FIG. 2 shows two potential diagrams 200, 210 of a radiation sensor pixel according to embodiments of the present invention, corresponding to one exemplary biasing configuration, during the integration period. Actions during the integration period may comprise, in embodiments of the present invention, subsequently biasing the transfer gate to the intermediate bias voltage $V_M$, hence the height of the potential barrier 202, 212 of the transfer gate would be $V_M$.

Charges 203, 213 generated by impinging radiation 204, 214 may at first be integrated on the sensing element 205, 215. If the charges 203 do not surpass the potential barrier 202, the sensing element 205 is not saturated, which corresponds to the potential diagram 200. Depending on the value of $V_M$ with respect to the radiation intensity received by the sensing element, the charges 213 may saturate the sensor 215, which corresponds to the potential diagram 210. The bias voltage $V_M$ may be selected from a range of values, hence allowing different levels of saturation during integration. If low values are selected, the radiation sensor pixel would be saturated for corresponding low radiation intensity.

In case saturation is reached (the right hand side of FIG. 2), in order to avoid leakage of charges, any possible overflown charge 216 can be transferred through the transfer gate 211 (biased by the intermediate bias voltage $V_M$ and forming the potential barrier 212) to the floating diffusion node FD. If a switch between the floating diffusion node FD and the charge storage device CS is closed, part of these overflown charges 216 may advantageously be collected onto a charge storage device (CS), avoiding some of the effects that negatively affect sensors, like charge blooming or leakage, which for instance may reduce resolution in sensor arrays or, saturate nearby sensing elements or, in some type of sensors like pixel arrays in cameras, produce ghosting and reduce image quality.

The storage charge device may thereto comprise a single capacitor connected to a switch which at its other end is connected to a floating diffusion node FD, or may comprise more than one capacitor, for example in a parallel configuration with switches regulating the charge transfer between them and the floating diffusion node.

Figure 3:
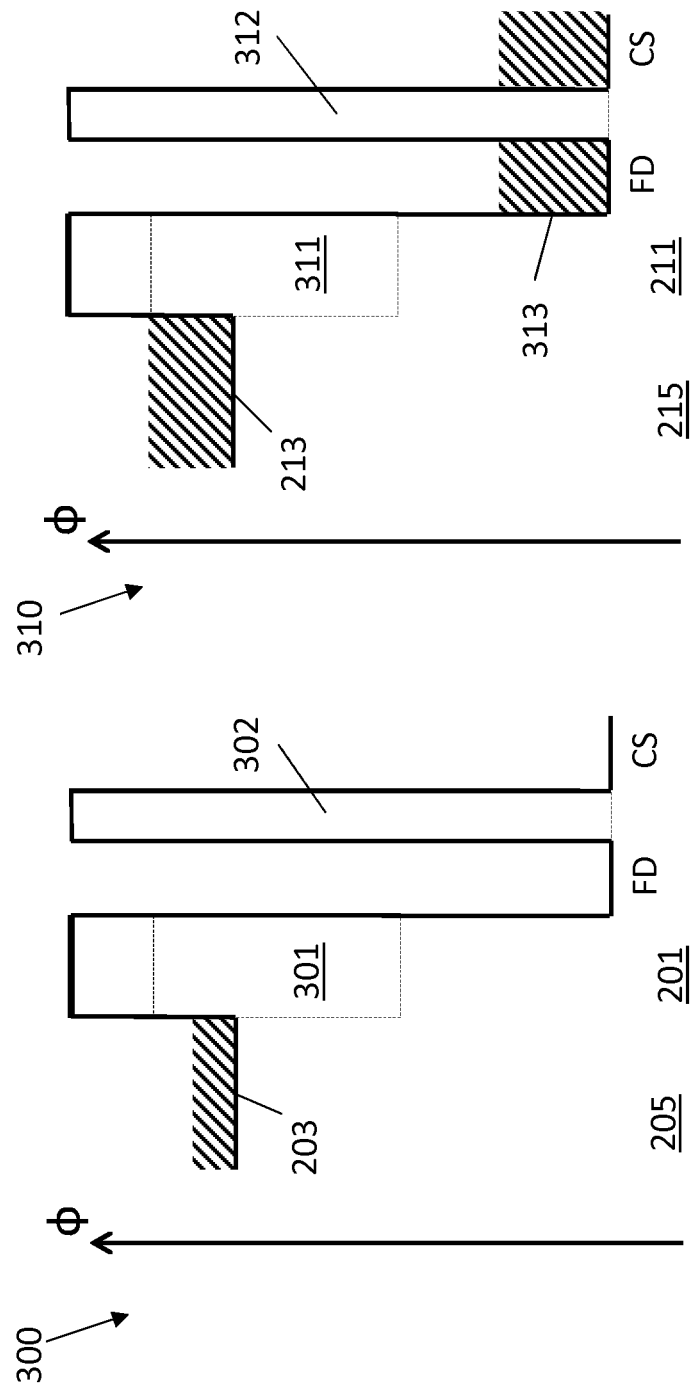
FIG. 3 shows a potential diagram of a radiation sensor pixel during a first part of a readout period according to embodiments of methods of the present invention.

FIG. 3 shows two potential diagrams 300, 310 of the radiation sensor pixel according to embodiments of the present invention, corresponding to one exemplary biasing configuration during the readout period.

Before the readout period starts, the transfer gate 201, 211 may be optionally be biased to an OFF bias $V_0$, effectively closing the transfer gate by the potential 301, 311 and impeding the flow of charges 203, 213 to the FD. Embodiments of the present invention are not limited to this configuration.

The switch coupled to the CS may be closed (hence creating the barrier 302, 312) so any charge from the previous period may be kept in the storage CS.

A pre-reading of charges may optionally be performed in the floating diffusion node FD. If the reading gives no significant value, the case is depicted in the first diagram 200 of FIG. 2 and the first diagram 300 of FIG. 3. On the other hand, if the reading results in a significant value, it can be anticipated that the radiation sensor pixel reached saturation during the integration phase (thus corresponding with the situation depicted in the second diagram 210 of FIG. 2 and in the second diagram 310 of FIG. 3). The amount 313 of charges which surpassed the saturation level, can be estimated or measured. This value can be used, for example, in adaptation techniques applied to radiation sensors, for instance for dynamically reducing the sensitivity of the pixels of a camera (reducing $V_M$ in the transfer gate 211 and hence increasing the barrier 212 in subsequent expositions during integration, FIG. 2), or alternatively increasing sensibility if no saturation has been reached, the present invention not being limited to this example. Alternatively, the pre-reading of the amount 313 of charges may optionally not be performed.

Figure 4:
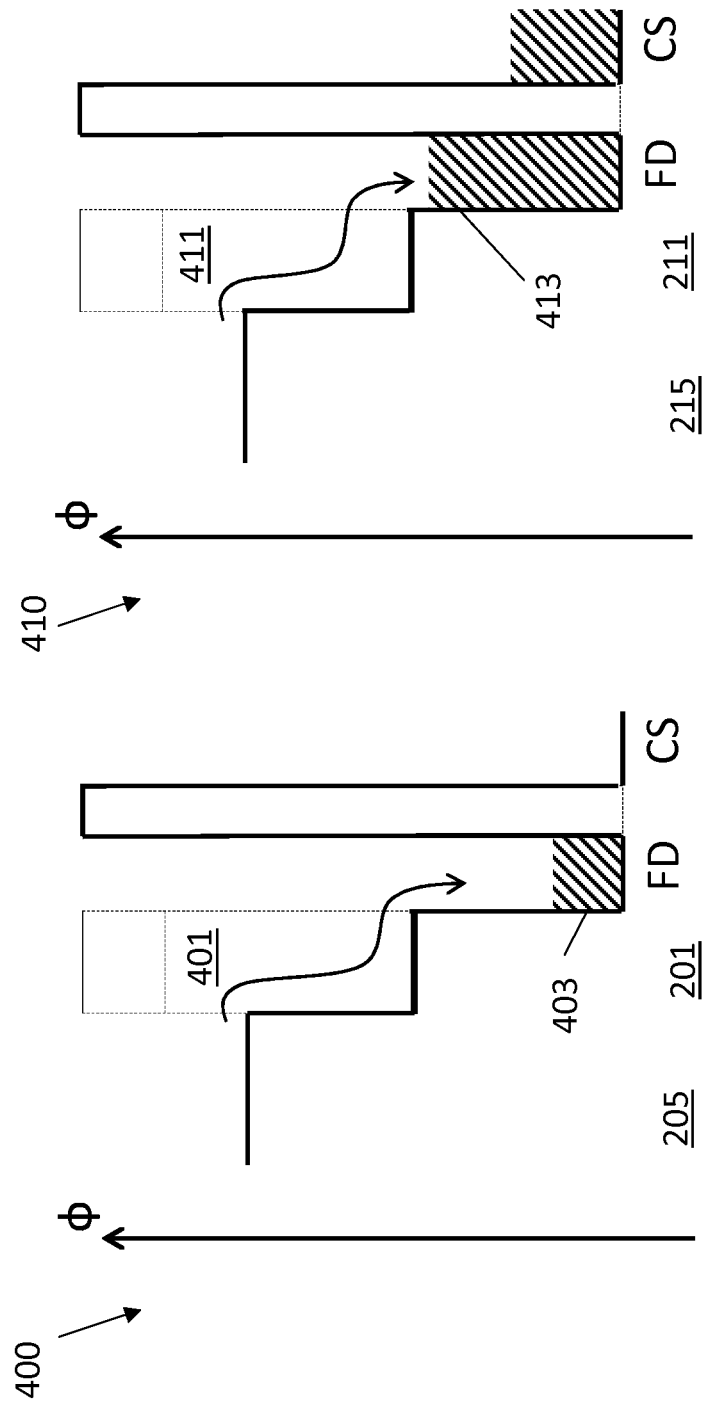
FIG. 4 shows a potential diagram of a radiation sensor pixel during to a second part of a readout period according to embodiments of methods of the present invention.

The readout period may further comprise, as shown in FIG. 4 a complete transfer 401, 411 of charges from the sensing element 205, 215 to the floating diffusion node FD. This transfer is performed by biasing the transfer gate 201, 211 to an ON bias voltage $V_1$ (by turning the transfer gate on), hence removing the barrier. The reading of these charges may be interpreted as the "signal level" 403, 413. If the sensing element did not saturate during the integration period, the signal level 403 comprises solely the charges integrated in the sensing element during the integration period (left hand side of FIG. 4), whereas if the saturation level has been surpassed during the integration period, the readings of the signal level 413 comprise a combination the readout level (emanating from the charges of the photodiode transferred to the FD during the readout period) and the level from the overflown charges transferred to the floating diffusion node during the integration period (right hand side of FIG. 4).

Figure 5:
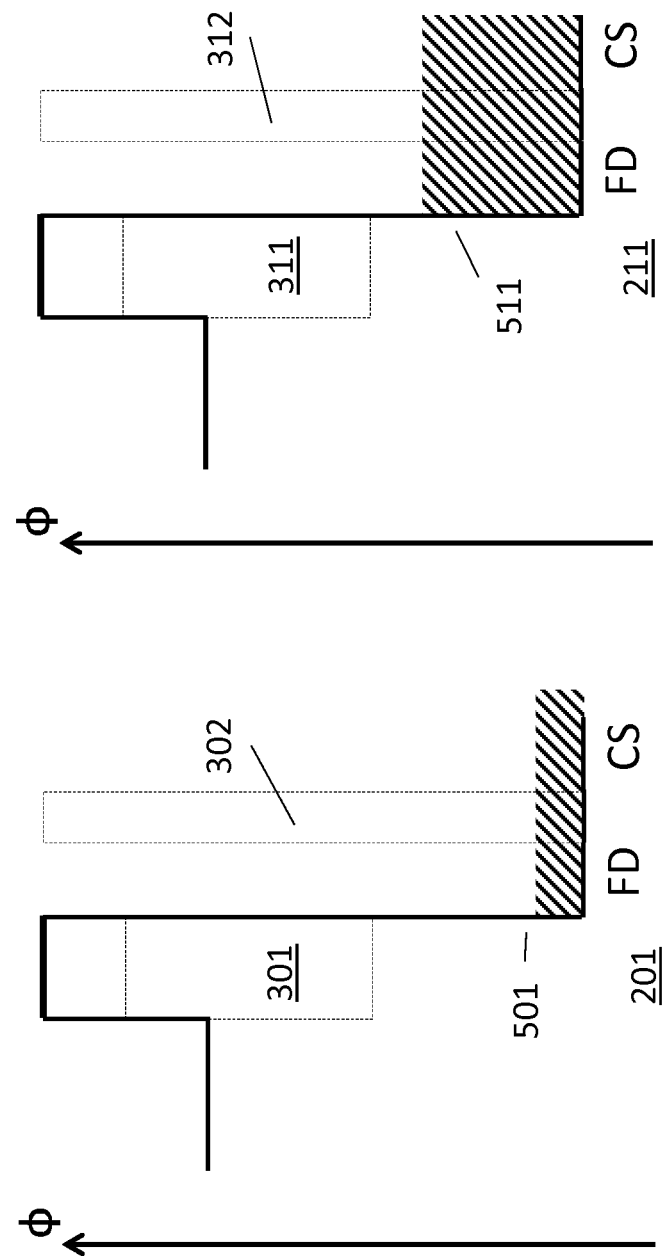
FIG. 5 shows a potential diagram of a radiation sensor pixel during charge merging, according to embodiments of methods of the present invention.

As seen in FIG. 5, the readout period may further comprise "closing" the transfer gate 201, 211 (biasing the gate to an OFF potential 301, 311), and subsequently merging the charges of the floating diffusion node FD with the charges kept in the charge storage device CS. This may be done, for instance, by opening a switch coupling the charge storage device CS with the floating diffusion node FD, thus eliminating the barrier 302, 312. Charges in the floating diffusion node after biasing the switch between CS and FD with an ON voltage would merge with the stored charges. After merging, the charges can be read as a "total" radiation level 501, 511, which may be higher than the maximum saturation level allowed by the sensing element, thus effectively and advantageously increasing the dynamic range of the radiation sensor pixels.

Figure 6:
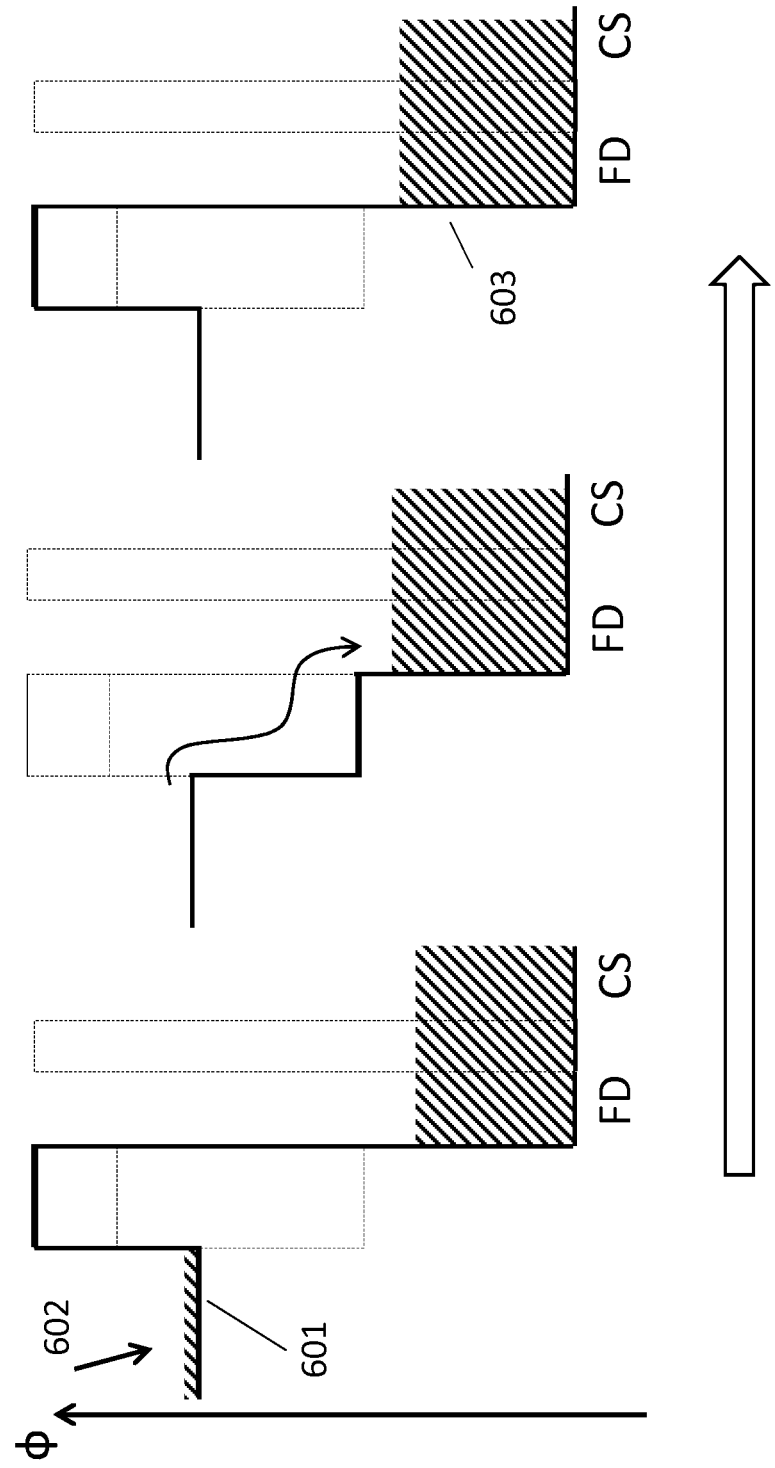
FIG. 6 shows an optional discharge cycle for readout of the low gain levels, according to embodiments of methods of the present invention

Additionally, as depicted in FIG. 6, the transfer gate 201, 211, may be cycled during the readout period, for instance after merging of the charges on the FD and the CS (for example, after the steps of connecting 127 the CS with FD and obtaining 128 the charge level, or after obtaining 128 the charge level, as shown in FIG. 1). The cycle may comprise a cycle of bias voltages (OFF-ON-OFF), indicated by an arrow, for reading any possible charge 601 generated due to radiation 602 impinging in the sensor during the readout period. These charges can be interpreted as "low gain" radiation level 603, which can also be merged and read, or read before merging. The present invention is not limited to these examples, and other cycles can be used at the same or different moments of the readout period.

By subtracting two signal levels from one another, correlated double sampling (CDS) can optionally be performed, thus obtaining a more accurate readout value. CDS can easily be performed if the optional pre-reading of the floating diffusion node has been performed, between the final readout signal 403, 413 or 501, 511, and the pre-reading of charges as in FIG. 2. Alternatively, the level of charge of the storage charge device CS can be read and subtracted from the signal level.

At the end of the readout period, the radiation sensor pixel may be reset, i.e. cleared from any charges being present.

A method according to embodiments of the first aspect of the present invention is not limited by the above steps and periods. For example, a separate transfer gate may be added, creating a more versatile electronic shutter, depending on each particular application, for instance accurately defining the duration of charge integration A second aspect of embodiments of the present invention relates to a radiation sensor pixel comprising a sensing element, for example a solid state sensing element, for instance a photodiode such as a PPD, a monolithic photodiode, the present invention not being limited to these examples. The sensing element is capable of generating charges as a response to impinging radiation; for instance when being impinged by corpuscular radiation like alpha or beta particles, positrons, etc.; or by electromagnetic radiation like gamma radiation, X-ray radiation, or by a radiation of a wavelength range between far infrared and ultraviolet. In particular embodiments of the second aspect of the present invention, the sensing element is a photoelectric sensor chiefly sensitive to visible radiation.

The radiation sensor pixel further comprises a floating diffusion node (FD) connected to at least one output of the radiation sensor pixel, and to at least one charge storage device. In particular embodiments of the present invention, the FD may be integrated in the substrate, for example it may be an area of n+ doping in a p-substrate, separated by a gap of substrate from the sensing element, the gap being covered by the transfer gate. The transfer gate may comprise an electrode and isolation layer, for example an oxide layer.

In embodiments of the present invention, a single transfer gate is provided between the sensing element and the floating diffusion node for controlling any transfer of charge from the sensing element to the floating diffusion node (FD). In particular, the single transfer gate may control the transfer of overflown charges to the FD. From there, the charges may be transferred to a charge storage device, depending on the operational state of a switch in between the floating diffusion node and a charge storage device. In particular embodiments of the second aspect of the present invention, the transfer gate may be connected to a drive circuit which may subsequently bias de transfer gate to at least three different bias levels, for instance bias levels corresponding to an ON state, an OFF state, and also at least one intermediate state. For example, if the transfer gate has transistor characteristics, the intermediate voltage can be obtained by varying the voltage in the ohmic region, although the present invention is not limited thereto.

A charge storage device is an element or circuit configuration capable of storing charges. For example, it may comprise at least one capacitor, e.g. an integrated capacitor, a metal-insulator-metal, polysilicon-insulator-polysilicon, MOS, integrated capacitor, other types being also possible. The charge storage device may also comprise a system of capacitors, for instance a plurality of capacitors in a parallel configuration, or connected through switches. The charge storage device may be connected to the output of the radiation sensor pixel. The charge storage device may be provided with means for resetting its value, for instance it may be connected to a reset transistor.

The output may comprise a readout circuit, ADCs, etc.

In some embodiments of the present invention, a flush gate (e.g. an electronic shutter) may be connected to the sensing element (e.g. connected to the PPD).

In some embodiments of the present invention, a reset transistor is connected to the floating diffusion node FD, for depletion of charge in the FD and restart. In some embodiments, an alternative or additional reset may be connected to the charge storage device CS for depleting the charge independently of the storage, if desired, for instance to create several cycles of saturation.

Figure 7:
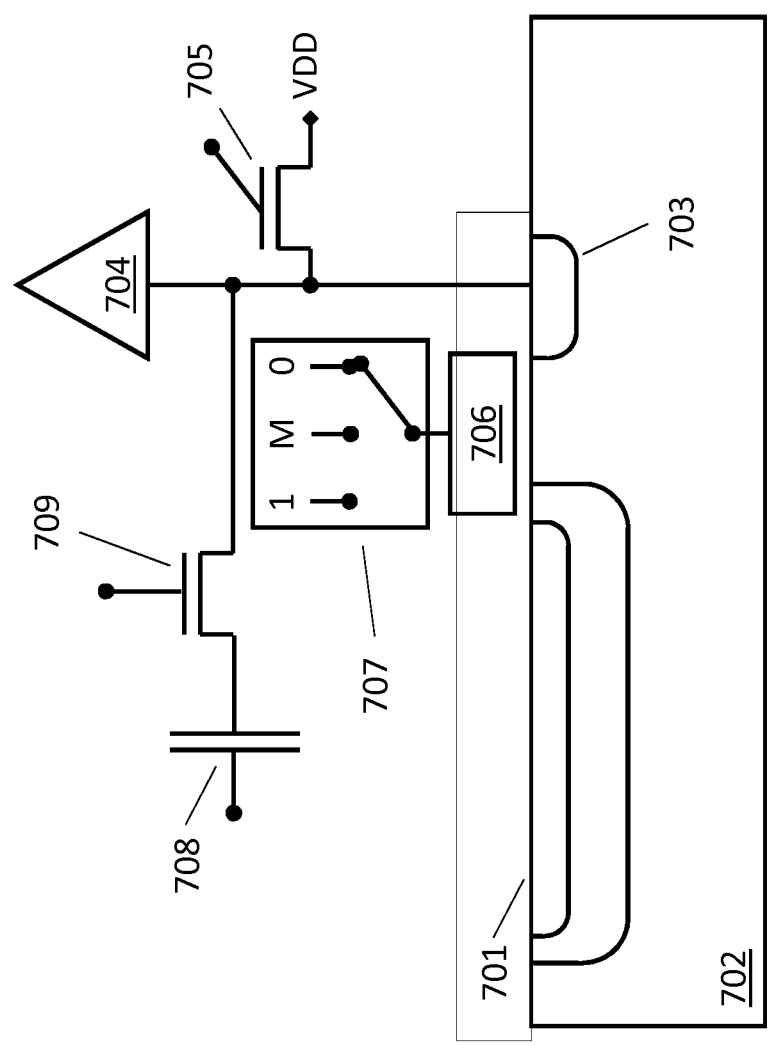
FIG. 7 is a schematic illustration of a radiation sensor pixel with one storage device according to embodiments of the present invention.

FIG. 7 schematically shows a configuration of a radiation sensor pixel according to an embodiment of the second aspect of the present invention. A sensing element 701 is shown, for example a pinned photodiode PPD (p+n) on a lightly doped p− substrate 702, although the present invention is not limited thereto. The floating diffusion node 703 may be for example a highly doped n+ region, the present invention not limited thereto, connected to an output 704, for example a readout circuit. A reset transistor 705 may be connected between the floating diffusion node 703 and a voltage source VDD for depletion of charges in the floating diffusion node 703. A transfer gate 706 is adapted for controlling the transfer of charges from the sensing element 701, e.g. pinned photodiode, to the floating diffusion node 703. The transfer gate 706 is controlled by a drive circuit 707, for example a selector, capable of sequentially biasing the transfer gate 706 to an ON bias voltage $V_1$, an intermediate or barrier voltage $V_M$, and an OFF bias voltage $V_O$. The drive circuit 707 may comprise an additional control for selection of the level of the barrier value $V_M$, hence allowing control of the saturation level of the radiation sensor pixel, for example during the integration period described in FIG. 2. A charge storage device, for example a capacitor 708, is connected to the floating diffusion node 703 through a switch 709, for example a transistor, for controlling the charging of the capacitor 708 and for example also controlling any charge merging in the FD 703, for example during the readout phase described in FIG. 5.

Figure 8:
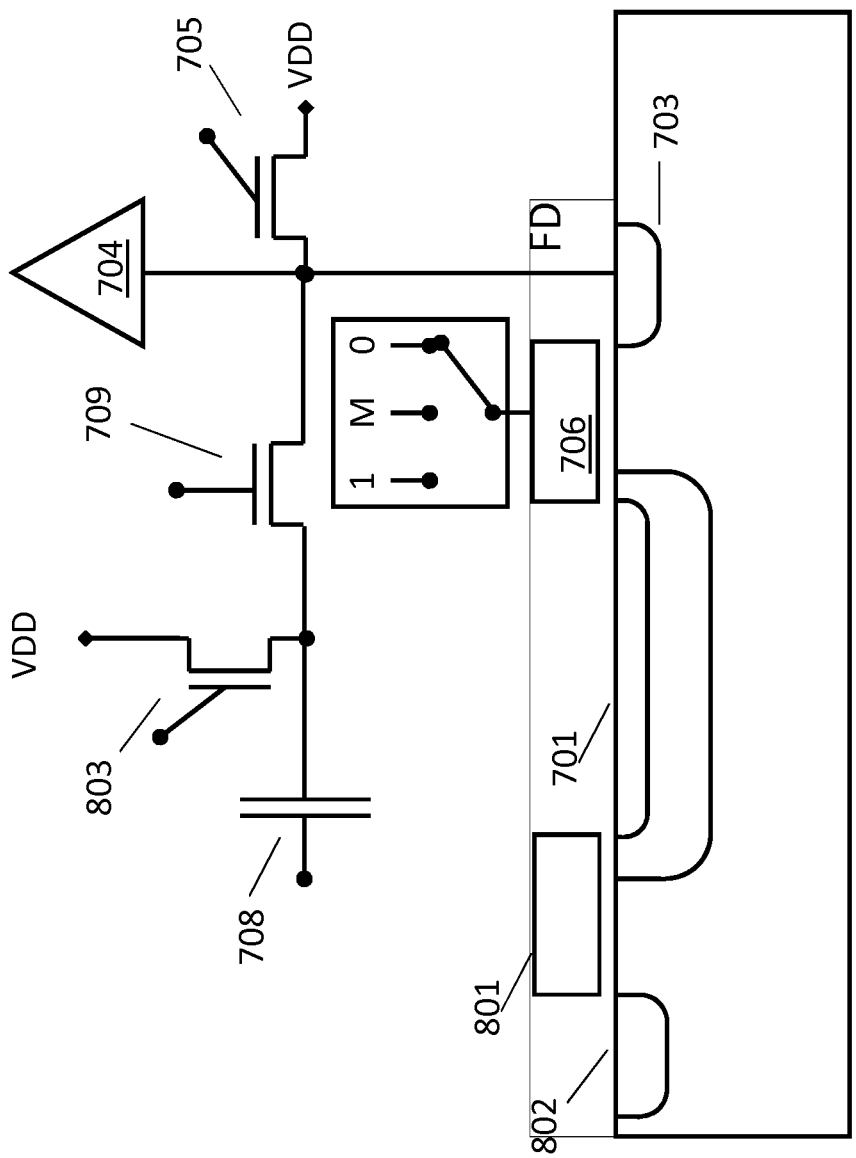
FIG. 8 is a schematic illustration of a radiation sensor pixel with one storage device, a charge storage reset switch, and an electronic shutter according to embodiments of the present invention.

Other features may be present in a radiation sensor pixel according to embodiments of the second aspect of the present inventions. For example, FIG. 8 shows a separate transfer gate acting as an electronic shutter 801 connected to the sensing element 701, e.g. photodiode which may deplete the charges of the sensing element to a drain region, for example 802. The electronic shutter may be, for example, a global shutter, and it may improve the control of the timing of determined phases (e.g. the integration phase). The present invention includes other possibilities, like connection of the electronic shutter 801 to an AC or signal node instead of a DC voltage.

Alternatively or additionally to the reset switch 705 connected to the output 704, a storage reset system 803, for example a transistor, can be added to the charge storage device 708 (e.g. a capacitor), for instance between the charge storage device 708 and the switch 709 for controlling the storage device 708 (and controlling the merging process).

Figure 9:
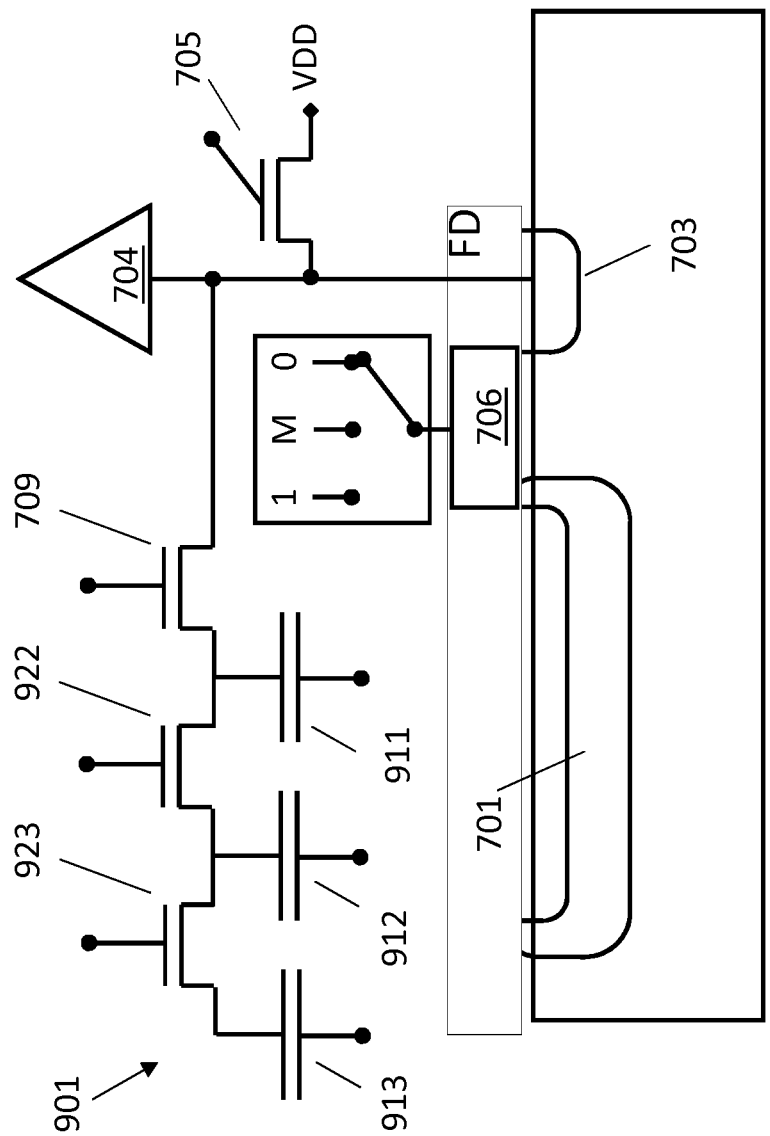
FIG. 9 is a schematic illustration of a radiation sensor pixel with a storage device comprising three capacitors and selector switches, according to some embodiments of the present invention.

Yet another possibility, depicted in FIG. 9, shows an alternative charge storage device 901 connected to the output 704 and the floating diffusion node 703, as before. The alternative charge storage device 901 comprises a plurality of capacitors, for example three capacitors 911, 912, 913, all connected to one another other with merge switches 923, 922 in between. Although in this example the capacitors and switches are in series, the present invention is not limited thereto, and other configurations (for example, parallel connection of capacitors and switches) are also possible. The alternative charge storage device 901 is connected, as in other embodiments, to the floating diffusion node 703 via a switch 709.

Figure 10:
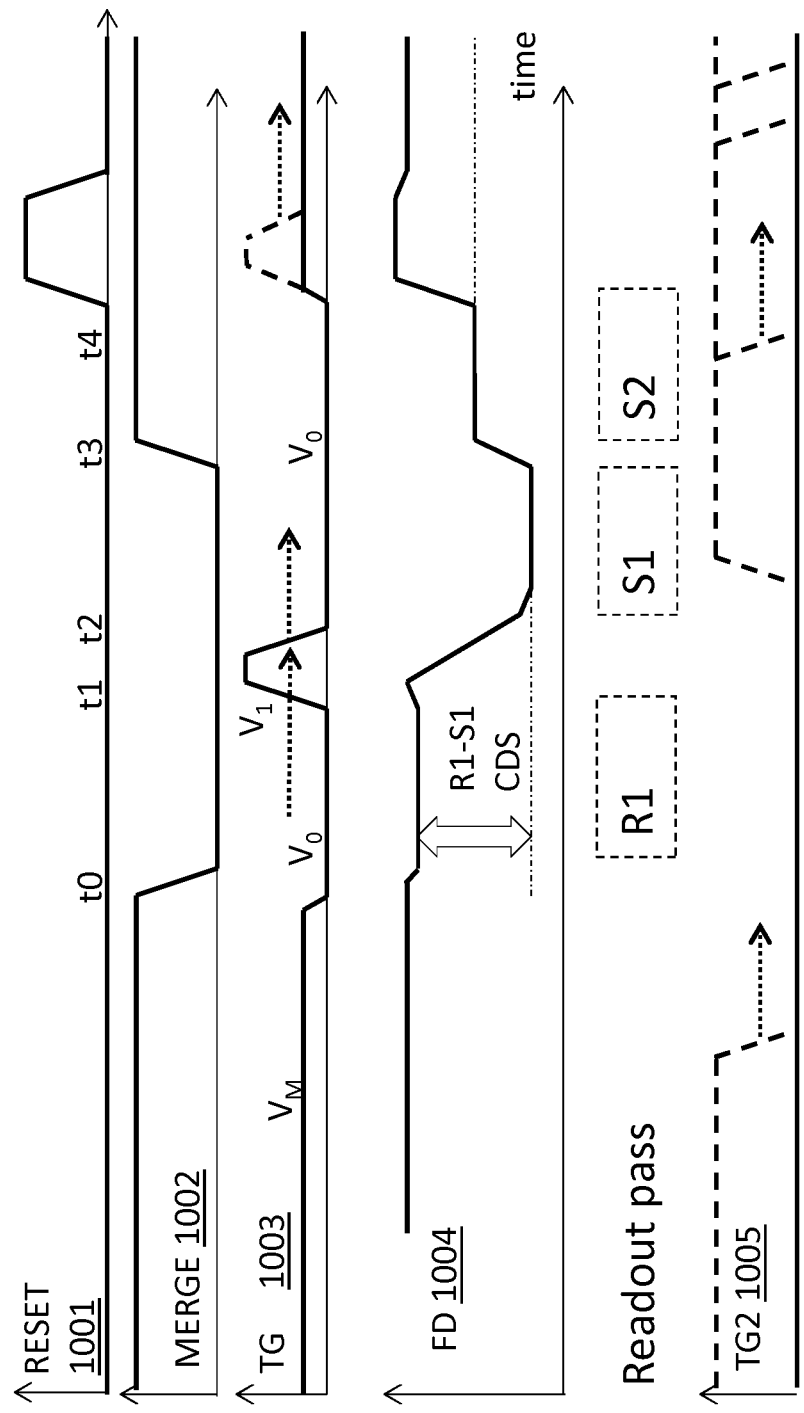
FIG. 10 shows an exemplary sequence according to embodiments of the present invention, for driving a radiation sensor pixel as schematically illustrated in FIG. 7.

A possible sequence of gate biasing and readout of the floating diffusion node is shown in FIG. 10. Taking into account the schematic sensor of FIG. 7, RESET graph 1001 shows the switching sequence of the reset transistor 705, MERGE graph 1002 shows the switching sequence of the switch transistor 709 between the floating node 703 and the charge storage device, TG graph 1003 shows the switching sequence of the transfer gate 706, the graph FD 1004 shows the signal read in the floating diffusion node 703, and the TG2 graph 1005 shows the switching sequence of an optional electronic shutter. Graph FD 1004 can be considered the readout signal.

It can be seen that in the period up to t0, which corresponds to the integration period, the reset transistor 705 is biased low, hence the reset switch is closed. It is considered that before the start of the operation the floating diffusion node has been reset to a high level (VDD), as can be seen from graph 1004. The merge transistor is biased to high, hence the charge storage device 708 is driven to be able to accept charges. The transfer gate 706 is biased to a $V_M$ bias, which is lower than the ON signal. Charges generated by the sensing element 701 as a response to impinging radiation may flow over the transfer gate 706 to the floating diffusion node 703, and from there over the merge switch 709 to the charge storage device 708. The signal on the floating diffusion node (graph 1004) show whether overflowing has taken place; which is not the case in the particular embodiment illustrated. At moment t0, which is the end of the integration period, the transfer gate 706 closes (TG is driven to an OFF bias voltage, for example a small voltage, or a 0 voltage, the present invention not being limited by these values), and the charge storage device (MERGE 1002) does not accept charges by opening the merge switch 709 (for instance by biasing a merge transistor to low). The integration period has finished.

Between t0 and t1, the reset switch 705 and the merge switch 709 are off, for instance by biasing the corresponding transistors to low, and the transfer gate 706 is also biased to low. Charges generated by the sensing element 701 are no longer passed on to the floating diffusion node 703. The FD 1004 shows the overflow level R1 (due to the crosstalk of the MERGE switch, this level may be slightly lower than the RESET level before t0), which may be read out by means of the output circuitry 704.

Then, at t1, the transfer gate 706 is biased to an ON bias voltage (for example, in case of a transistor, the voltage would be the saturation characteristic for the transistor), as can be seen in the TG graph 1003, while the reset switch 705 an the merge switch 709 are still OFF. The charge present in the sensing element 701 is transferred from the sensing element to the floating diffusion node 703.

At the moment t2, after depletion of the sensing element, the transfer gate 706 is driven again to an OFF bias, and the amount of charges present at the floating diffusion node 703 may be read out. The signal S1 read out corresponds to the amount of charges transferred from the sensing element 701 to the floating diffusion node 703 during the charge transfer period t1-t2, together with some charges which were already present on the floating diffusion node due to overflow of the sensing element. The reading S1 of the floating diffusion node can be used together with the earlier reading R1 of the reset level or the overflow level to obtain a downstream CDS output.

At t3, the merge switch 709 is closed, for instance by biasing a merge transistor to high. The charges of the charge storage device are merged with the charges present on the floating diffusion node 703, and a further readout S2 of the floating diffusion node can be taken. Both readout signals S1 and S2 result in a readout which has higher dynamic range than the readout of the sensing element alone.

At t4, the reset switch 705 is closed, for instance by biasing a reset transistor to high, thus resetting the floating diffusion node to reset level. Optionally also the transfer gate 706 can be biased to high, so as to also reset the sensing element 701. A new cycle integration+readout can start.

If an electronic shutter is present, graph TG2 1005 shows an additional control of the process during the integration and readout periods. For example, when the TG2 is high, thus "on", it permanently drains the photocharges from the photodiode. The integration period only actually starts when TG2 goes low, thus "off". Hence, the TG2 electronic shutter allows to change the start of the integration period.

Figure 11:
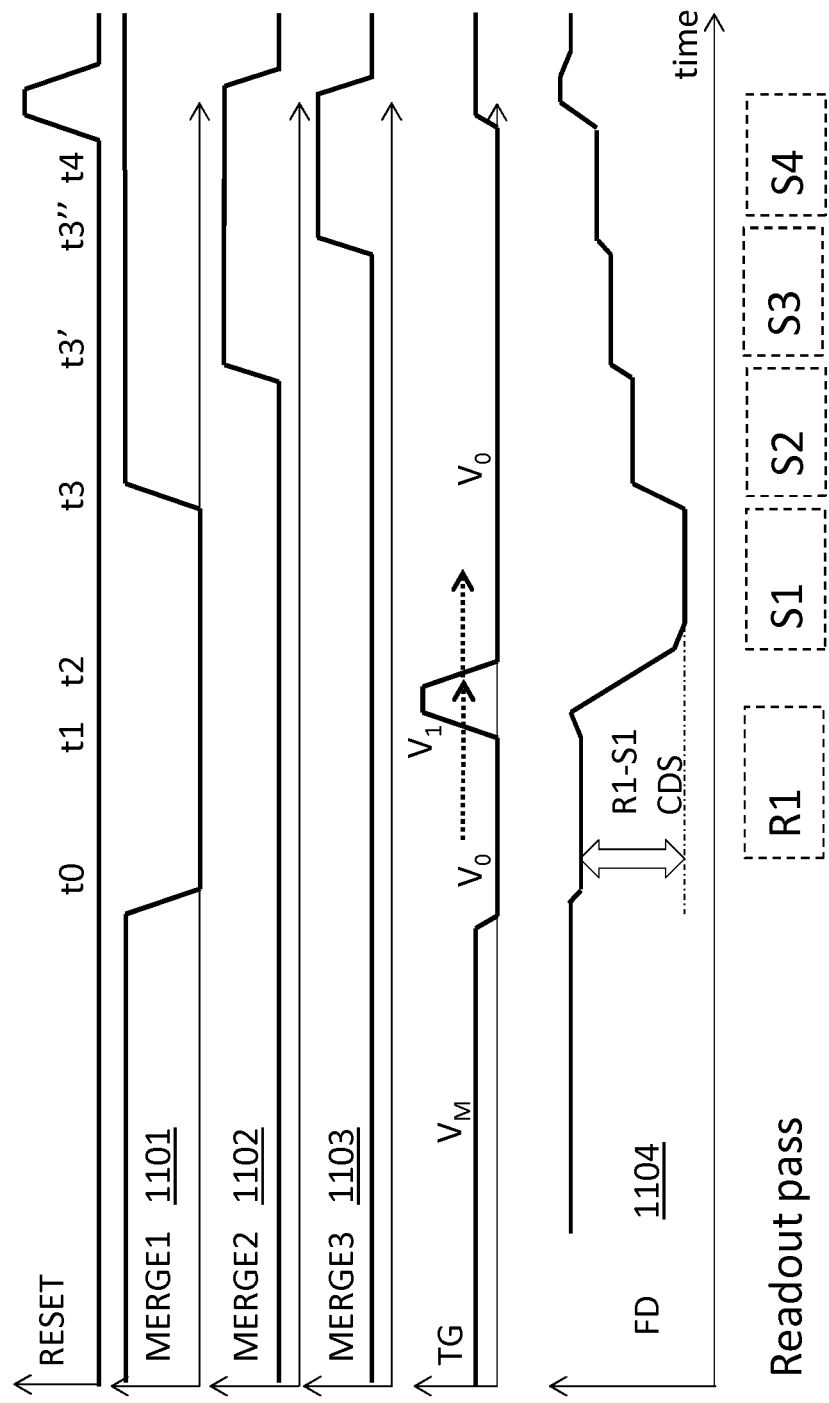
FIG. 11 shows another sequence according to embodiments of the present invention for driving the radiation sensor pixel schematically illustrated in FIG. 9.

Another possible sequence is shown in FIG. 11. This sequence makes reference to the circuit schematically illustrated in FIG. 9, wherein the MERGE1 graph 1101 refers to the state of the merge switch 709, the MERGE2 graph 1102 refers that of the second switch 922 and the MERGE3 graph 1103 refers to that of the third switch 923.

The integration period (up to t0), the readout period of the reset or overflow level (between t0 and t1), and the charge transfer period (between t1 and t2) are the same as in the example of FIG. 10. However, during the actual signal readout period of the present example, merging the charges stored in the three capacitors 911, 912 and 913 with the charges in the floating diffusion node 703 is performed subsequently. At first, between moments t2 and t3 a readout of the signal level S1 on the floating diffusion node 703 takes place, similar as in the example of FIG. 10. Thereafter, at moment t3, the merge switch 709 is turned on, for instance by biasing a corresponding merge transistor to high, and a signal level S2, corresponding to merged charges of the floating diffusion node and the first charge storage node 911, is read out, also similar as in the example of FIG. 10. At moment t3', while the merge switch 709 remains ON, a second merge switch 922 is switched on, and thereafter a signal level S3, corresponding to the earlier merged charges together with the charges previously stored on the second charge storage device 912, is read out. At moment t3'', while the merge switches 709 and 922 remain on, a third merge switch 923 is switched on, a signal level S4, corresponding to the earlier merged charges together with the charges previously stored on the third charge storage device 913, is read out.

The present invention is not limited by the above illustrative embodiments, and additional or alternative sequences may be included (e.g. using two-step charge storage, additional reset sequences, etc).

The invention claimed is:

1. A method of driving a radiation sensor pixel the method comprising:
generating charges, by a sensing element, as a response to impinging radiation,
transferring charges from the sensing element to a floating diffusion node, using a transfer gate between the sensing element and the floating diffusion node to control the transfer, sequentially biasing the transfer gate to at least three different bias voltages, wherein the at least three bias voltages comprise at least an OFF bias voltage, an ON bias voltage and an at least one intermediate bias voltage, and
activating a switch to allow a charge storage device to accept charges from the floating diffusion node at least during biasing the transfer gate to the intermediate bias voltage.

2. The method of claim 1, the driving of the radiation sensor pixel further comprising at least an integration period during which charges are integrated on the sensing element, wherein sequentially biasing the transfer gate to at least three different bias voltages comprises biasing the transfer gate to the intermediate bias voltage during at least part of the integration period, thus transferring to the floating diffusion node and the charge storage device part of the integrated charges that may overflow the transfer gate.

3. The method of claim 2, the driving of the radiation sensor pixel further comprising at least a readout period during which charges previously integrated on the sensing element are read out,
wherein sequentially biasing the transfer gate to at least three bias voltages comprises a transitory biasing of the transfer gate to ON bias, thus transferring the integrated charges to the floating diffusion node, while not allowing the charge storage device to accept charges, and sequentially reading the charge levels in the floating diffusion node.

4. The method of claim 3, wherein correlated double sampling is done on the difference in charges present on the floating diffusion node before and after biasing the transfer gate ON.

5. The method of claim 2, the driving of the radiation sensor pixel comprising at least a readout period during which charges previously integrated on the sensing element are read out,
wherein sequentially biasing the transfer gate to at least three bias voltages comprises biasing the transfer gate by the OFF bias voltage between the integration period and the subsequent readout period.

6. The method of claim 2, wherein transferring part of the integrated charges is performed solely through the transfer gate.

7. The method of claim 1, further comprising merging charges stored on the charge storage device with charges present on the floating diffusion node.

8. The method of claim 1, wherein an electronic shutter gate is able to reset the charge from the sensing element.

9. A radiation sensor pixel comprising:
a sensing element capable of charge generation as a response to impinging radiation,
a floating diffusion node,
a single transfer gate configured to control a transfer of charges from the sensing element to the floating diffusion node,
a charge storage device,
a switch configured to control a transfer of charges from the floating diffusion node to the charge storage device, and
a drive circuit adapted for sequentially biasing the single transfer gate to at least three different bias levels during a same integration period.

10. The radiation sensor pixel of claim 9, further comprising an output stage configured to generate a signal representative of the amount of electrical charge on the floating diffusion node separately, on the charge storage device separately, or on both.

11. The radiation sensor pixel of claim 9, wherein the sensing element comprises at least one pinned photodiode.

12. The radiation sensor pixel of claim 9, wherein the charge storage device comprises at least one capacitor.

13. The radiation sensor pixel of claim 9, wherein the charge storage device comprises a merger transistor configured to selectively open a conductive path between the charge storage device and the floating diffusion node.

14. The radiation sensor pixel of claim 9, further comprising a reset transistor.

15. The radiation sensor pixel of claim 14, wherein the reset transistor is connected to the floating diffusion node.

16. The radiation sensor pixel of claim 14, wherein a reset transistor is connected to the charge storage device.

17. The radiation sensor pixel of claim 9, further comprising a flush gate connected to the sensing element.

18. The radiation sensor pixel of claim 9, wherein the sensing element is equipped for detection of electromagnetic radiation, particles or both.

19. A sensor array comprising a plurality of radiation sensor pixels, wherein each of the radiation sensor pixels comprises:
- a sensing element that generates charge as a response to impinging radiation;
- a floating diffusion node;
- a transfer gate that controls a transfer of charges from the sensing element to the floating diffusion node;
- a charge storage device;
- a switch configured to control a transfer of charges from the floating diffusion node to the charge storage device; and
- a drive circuit that sequentially biases the transfer gate to at least three different bias levels during a same integration period, wherein the at least three different bias levels include at least an OFF bias voltage, an ON bias voltage, and at least one intermediate bias voltage between the OFF bias voltage and the ON bias voltage,
- wherein the switch allows the transfer of charges from the floating diffusion node to the charge storage device at least during biasing of the transfer gate to the intermediate bias voltage.

20. The array of radiation sensor pixels according to claim 19, each of the radiation sensor pixels further comprise a flush gate that acts as a shutter to obtain a global shutter in the sensor array.

* * * * *